(12) United States Patent
Blank et al.

(10) Patent No.: US 8,757,345 B2
(45) Date of Patent: Jun. 24, 2014

(54) MAGNETIC ROTATIONAL HARDSTOP FOR ROBOT

(75) Inventors: Rich Blank, San Jose, CA (US); Jim Roberts, San Jose, CA (US); Wayne Tang, Union City, CA (US); Michael Bergeson, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 1130 days.

(21) Appl. No.: 12/432,620

(22) Filed: Apr. 29, 2009

(65) Prior Publication Data

US 2010/0278623 A1 Nov. 4, 2010

(51) Int. Cl.
*G05G 5/00* (2006.01)
*G05G 5/04* (2006.01)

(52) U.S. Cl.
USPC .......................................................... 192/139

(58) Field of Classification Search
CPC ........ B25J 19/0091; B25J 19/06; B25J 9/101; G05G 5/04
USPC ................. 74/10.1, 10.2, 89.37, 380, 490.01, 74/490.05, 490.13, 526; 192/116.5, 139, 192/148, 149; 414/744.5, 749.1; 901/11, 901/12, 13, 17, 49
See application file for complete search history.

(56) References Cited

U.S. PATENT DOCUMENTS

| | | | | |
|---|---|---|---|---|
| 3,467,973 A | * | 9/1969 | Minnick | 5/719 |
| 4,751,986 A | * | 6/1988 | Takahashi | 188/85 |
| 4,828,094 A | * | 5/1989 | Torii et al. | 192/139 |
| 4,953,992 A | * | 9/1990 | Torii et al. | 384/607 |
| 5,449,211 A | | 9/1995 | Monford | |
| 5,473,961 A | * | 12/1995 | Jackson et al. | 74/526 |
| 5,771,753 A | * | 6/1998 | Kwon et al. | 74/526 |
| 5,775,169 A | | 7/1998 | Solomon et al. | |
| 5,839,322 A | | 11/1998 | Genov et al. | |
| 6,078,876 A | * | 6/2000 | Rosenberg et al. | 702/152 |

(Continued)

FOREIGN PATENT DOCUMENTS

| | | | |
|---|---|---|---|
| CN | 201007333 Y | * | 1/2008 |
| CN | 201068947 Y | * | 6/2008 |

(Continued)

OTHER PUBLICATIONS

Layton, Bill. Discussion of California Highschool Physics Standards, Energy and Momentum 2g. UCLA, Apr. 20, 2009, pp. 1-4 [online], [retrieved on May 20, 2013]. Retrieved from the internet <URL: http://www.physics.ucla.edu/HighSchoolPhysics/Momentum_and_Energy/>.*

(Continued)

*Primary Examiner* — Saul Rodriguez
*Assistant Examiner* — Brendan Tighe
(74) *Attorney, Agent, or Firm* — Weaver Austin Villeneuve & Sampson LLP (57) ABSTRACT

Rotational hardstop assemblies that provide greater than 360 degrees of non-continuous rotation for rotating mechanisms are provided. In certain embodiments, an assembly is used to provide 630 or more degrees of rotation for the shoulder axis of a robot, such as a wafer transfer robot. The rotational hardstop assemblies include opposing magnets as springs. According to various embodiments, the opposing magnets provide non-contact engagement and produce no contact noise nor have any wear over time. The rotational hardstop assemblies provide the ability to location from either direction of rotation of a robot cylindrical coordinate system.

15 Claims, 9 Drawing Sheets

(56) References Cited

U.S. PATENT DOCUMENTS

| | | | | |
|---|---|---|---|---|
| 6,105,454 | A * | 8/2000 | Bacchi et al. | 74/490.03 |
| 6,487,738 | B1 * | 12/2002 | Graebe | 5/719 |
| 6,729,462 | B2 * | 5/2004 | Babbs et al. | 198/346.2 |
| 6,826,977 | B2 * | 12/2004 | Grover et al. | 74/490.03 |
| 7,054,775 | B2 * | 5/2006 | Rosenberg et al. | 702/95 |
| 7,579,935 | B2 * | 8/2009 | Ohta et al. | 335/220 |
| 2004/0178042 | A1 * | 9/2004 | Huang | 192/139 |
| 2006/0043750 | A1 * | 3/2006 | Wirth | 294/103.1 |
| 2007/0020080 | A1 * | 1/2007 | Wirth | 414/744.5 |
| 2007/0139752 | A1 * | 6/2007 | Bernstein et al. | 359/224 |
| 2009/0174289 | A1 * | 7/2009 | Tanner | 310/339 |
| 2011/0072918 | A1 * | 3/2011 | Reekers | 74/55 |
| 2013/0305866 | A1 * | 11/2013 | Krumbacher et al. | 74/490.03 |

FOREIGN PATENT DOCUMENTS

| | | | |
|---|---|---|---|
| CN | 201078424 Y | * | 6/2008 |
| CN | 201080984 Y | * | 7/2008 |
| CN | 201246432 Y | * | 5/2009 |
| JP | 2008042995 A | * | 2/2008 |
| KR | 10-1989-0001615 B1 | | 5/1989 |
| TW | 356030 U | * | 5/2009 |

OTHER PUBLICATIONS

International Search Report and Written Opinion from Application No. PCT/US2010/031489 mail Jan. 20, 2011.

* cited by examiner

First Motion: arm and moving hardstop rotate until magnetic assemblies engage

Second Motion: arm rotates to desired endpoint

MAGNETIC ROTATIONAL HARDSTOP FOR ROBOT

BACKGROUND OF THE INVENTION

Cylindrical robots are used for picking and placing objects in a variety of applications including in wafer transfer systems in semiconductor processing. Their axes form a cylindrical coordinate system with the robot arms having radial, rotational and vertical motion. Robots that have greater than 360° rotation improve throughput by allowing objects to be picked and placed using a minimum or reduced number of moves than required with robots that have a range of motion of 360° or less.

Continuous rotation functions well for optimized robot motion and throughput but requires an electrical and pneumatic slip ring assembly. Standard cables through the shoulder also cannot be used, as rotating over 360° will lead to breakage and or entanglement of the cables. Hardstop assemblies are used to prevent over-rotation of the arm, so that cables and tubings through the shoulder are not over-rotated past their functional limit. To prevent rotation over 360°, a structural feature is provided to engage with another structural feature that rotates along with the arm. By engaging, the arm is prevented from over-rotating in either direction. As a result, it may be necessary to reverse course and travel longer paths (e.g., to get from 260° to 10°, it is necessary to travel 250°, rather than 110°). This also limits a robot's accessible range within an environment. Moving hardstops may be used to provide non-continuous rotation over 360°.

SUMMARY OF THE INVENTION

Rotational hardstop assemblies that provide greater than 360 degrees of non-continuous rotation for rotating mechanisms are provided. In certain embodiments, an assembly is used to provide between 360 and 720 degrees of rotation for the shoulder axis of a robot, such as a wafer transfer robot. The rotational hardstop assemblies include opposing magnets. According to various embodiments, the opposing magnets provide non-contact engagement and produce no contact noise nor have any wear over time. The rotational hardstop assemblies provide the ability to access locations from either direction of rotation of a robot cylindrical coordinate system.

One aspect of the invention relates to apparatuses for limiting rotation in a mechanism having θ-rotational motion about a Z-axis. In certain embodiments, the apparatuses include a stationary member having a stationary magnetic assembly mounted thereon, said stationary magnet assembly comprising one or more magnets arranged lengthwise such that a first magnetic pole is at a first end of the assembly and a second magnetic pole is at a second end of the assembly; and a rotatable stop member adjacent to the stationary member having a rotatable magnetic assembly mounted thereon, said rotatable magnet assembly comprising one or more magnets arranged lengthwise such that a third magnetic pole is at a first end of the rotatable assembly and a fourth magnetic pole is at a second end of the rotatable assembly; wherein the rotatable magnetic assembly is engageable with the stationary magnetic assembly and wherein the rotatable stop is configured to rotate with the mechanism when not engaged by the stationary member.

The stationary member may be part of a robot drive, such as a shoulder. It may have a circular interior and/or exterior surface. The stationary magnetic assembly is mounted on the stationary member, such that magnetic poles on either end are exposed to meet with a magnetic pole on the rotatable assembly. The stationary member and stationary magnetic assembly are configured to provide a clear path for the rotatable magnetic assembly to rotate when not engaged by the stationary magnetic assembly. In certain embodiments, the stationary magnetic assembly protrudes from an interior surface of the stationary member. In other embodiments, the stationary magnetic assembly may protrude from an exterior surface or be mounted on top of or under a surface of the stationary member. In certain embodiments, the stationary member defines an annular recess or other annular path in which the stationary magnetic assembly is disposed and around which the rotational magnetic assembly is rotatable. Embodiments in which only one magnetic pole is exposed, e.g., for rotation in one direction, or wherein the magnetic poles are not physically exposed but have enough force to act as non-contact springs, are also within the scope of the invention. The stationary magnet assembly may have one or more magnets.

The rotatable stop member is configured to rotate with the mechanism when not engaged by the stationary member. In certain embodiments, it is mounted on the mechanism, e.g., on a bearing located between the rotatable stop member and the mechanism. The rotatable stop member may be an annular member. The rotatable stop member includes a rotatable magnetic assembly.

The stationary magnet assembly is engageable with the rotatable magnet assembly to halt rotation of the rotatable stop member beyond a selected rotational position. In certain embodiments, the apparatus is configured such that the third magnetic pole is proximal to the first magnetic pole at a selected rotational position to thereby halt rotation of the rotatable stop member beyond the selected rotational position. The fourth magnetic pole may be proximal to the second magnetic pole at a selected rotational position to thereby halt rotation in the reverse direction of the rotational stop member.

The rotatable magnetic assembly is mounted on the rotatable stop member, such that magnetic poles on either end are exposed to meet with a magnetic pole on the stationary assembly. The rotatable stop member and stationary member are configured such that repelling poles of their respective magnetic assemblies are proximate at engagement, e.g., south-south or north-north. In certain embodiments, the apparatus includes an additional stop structure to halt rotation of the mechanism beyond a selected rotational position. This may be a divot, pin or any other stop structure. In certain embodiments, additional magnetic assemblies may be used.

In certain embodiments, the mechanism is or is part of a robotic arm mechanism capable of θ-rotational motion. The robotic arm mechanism may also be capable of radial and vertical movement.

In certain embodiments, the one or more magnets of the stationary and rotational magnet assemblies are arced such that the curvature of the magnet(s) of the stationary magnetic assembly matches that of the magnet(s) of the rotatable magnetic assembly. This allows the full possible opposing force between the magnets to be used for engagement.

In certain embodiments, engagement between the stationary member and the rotatable stop member is non-contact engagement. Engagement occurs when a pole of the rotatable magnetic assembly is rotated into a proximal position to a pole of the stationary magnetic assembly. The opposing magnetic force (between two south poles or between two north poles) is enough to overcome the bearing or other force that allows the rotatable stop member to rotate with the rotating mechanism.

Another aspect of the invention relates to methods for rotating a mechanism having θ-rotational motion about a Z-axis using a stationary member having a stationary magnetic assembly mounted thereon, and a rotatable stop member adjacent to the stationary member having a rotatable magnetic assembly mounted thereon. According to various embodiments, the methods involve rotating the mechanism and rotatable stop member in a first rotational direction; at a selected rotational position, engaging the rotatable stop member with the stationary member to thereby halt rotation of the rotatable stop member and render it stationary, wherein said engagement is non-contact; and rotating the mechanism past the rotatable stop member in the first rotational direction.

In certain embodiments, the methods may involve stopping the mechanism at a second selected rotational position, and then rotating the mechanism in a second rotational direction, the second rotational direction being the reverse of the first rotational direction. The rotatable stop member and the rotating mechanism may then be rotated in a second rotational direction. In certain embodiments, the rotatable stop member is then engaged with the stationary member at a third selected rotational position. The rotating mechanism is then rotated past the rotatable stop member is the second rotational direction.

According to various embodiments, the methods may be used to pick a substrate from a first location and place it at a second location and/or place a substrate at a third location and pick a wafer from a fourth location.

A further aspect of the invention relates to systems for substrate transfer. According to various embodiments, the system includes a plurality of pick and place locations; and a substrate transfer robot that includes a) a robot arm configured for non-continuous rotation greater than 360° and b) a magnetic rotational hardstop assembly. The plurality of pick and place locations may include some combination of substrate storage containers, loadlocks and/or processing stations. The magnetic rotational hardstop assembly may be configured to provide non-contact engagement between a rotatable stop member and a shoulder of the robot.

These and other features and advantages of the present invention will be described in more detail below with reference to the associated drawings.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

The apparatuses and methods described herein may be used to provide greater than 360° of rotation of a rotatable member or mechanism about a Z-axis. For the purposes of discussion, the below description refers to the mechanism being a rotatable robot arm. However, one of skill in the art will understand that the rotational magnetic hardstop assemblies described are not so limited, but may be used to provide greater than 360° non-continuous rotation greater of any rotatable mechanism.

Figure 1:
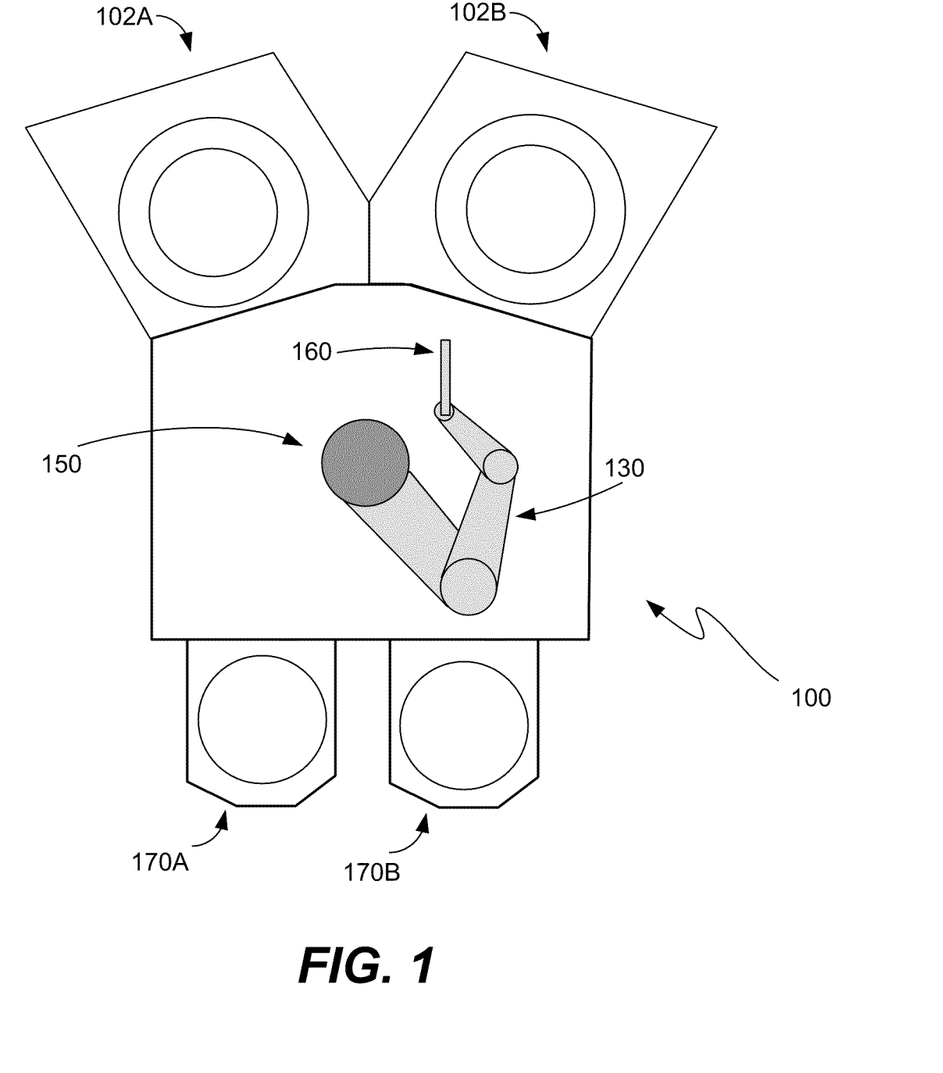
FIG. 1 shows a plan view of a wafer processing system in accordance with embodiments of the present invention.

As indicated, the apparatuses and methods described herein may be used to provide greater than 360° of a robot arm about a Z-axis (greater than 360° in the theta direction). In certain embodiments, the apparatuses and methods are used to move semiconductor wafers between processing stations, loadlocks, storage units (e.g., Front Opening Unified Pods or FOUPs), etc. FIG. 1 shows a plan view of a wafer processing system 100 in accordance with an embodiment of the present invention. System 100 includes a robot 150, one or more load locks 102 (i.e., 102A, 102B), and one or more wafer storage units 170 (i.e., 170A, 170B).

Robot 150 is a multi-link robot suitable for handling wafers in a wafer processing system. Robot 150 is configured to move wafers between load locks 102 and storages units 170. Robot 150 includes a robot arm 130 and an end effector 160 for supporting one or more wafers. (The robot may also have multiple end effectors; for ease of description only one is depicted). Robot 150 is configured to impart rotational (θ or theta) to arm 130 and end effector 160. The robot may also be configured to impart radial ("R"; radially from the center of robot 150), and vertical ("Z"; height) motion to end-effector 160. Thus, a wafer may be picked up from a pick location by rotating to face the pick location, lowering to a position below the wafer, extending to the pick up location, and rising to pick up the wafer. The end effector 160 may then be retracted, and the robot arm 130 and end effector 160 rotated to face a place location, extending the place location and lowering the place the wafer. The system 100 is just an example of a wafer transfer system in which the apparatuses and methods described herein may be employed. For example, in certain embodiments, they may be employed in a system for transfer between loadlocks and processing modules.

Robot 150 is configured to impart non-continuous rotation with a range above 360° to arm 130. In general, rotation of a robot arm may be accomplished via a number of methods. Continuous rotation functions well for optimized robot motion and throughput but requires an electrical and pneumatic slip ring assembly. Standard cables through the shoulder also cannot be used, as rotating over 360° will lead to breakage and or entanglement of the cables. Hardstop assemblies are used to prevent over-rotation of the arm, so that cables and tubings through the shoulder are not over-rotated past their functional limit. To prevent rotation over 360°, a structural feature is provided to engage with another structural feature that rotates along with the arm. By engaging, the arm is prevented from over-rotating in either direction. As a result, it may be necessary to reverse course and travel longer paths (e.g., to get from 260° to 10°, it is necessary to travel 250°, rather than 110°). This also limits a robots' accessible range within a mini-environment such as that depicted in FIG. 1. Typically a robot has only about 270° of full range with non-continuous rotation less than 360°. Rotation greater than 360° may be accomplished using a moving hardstop, as described further below. However, if soft materials are used to absorb the impact of the rotating hardstop, the stop structures are unable to absorb the inertia during fast moves, creating a clicking sound if the move is too fast. Soft materials also wear and may cause a premature failure.

Figure 2A:
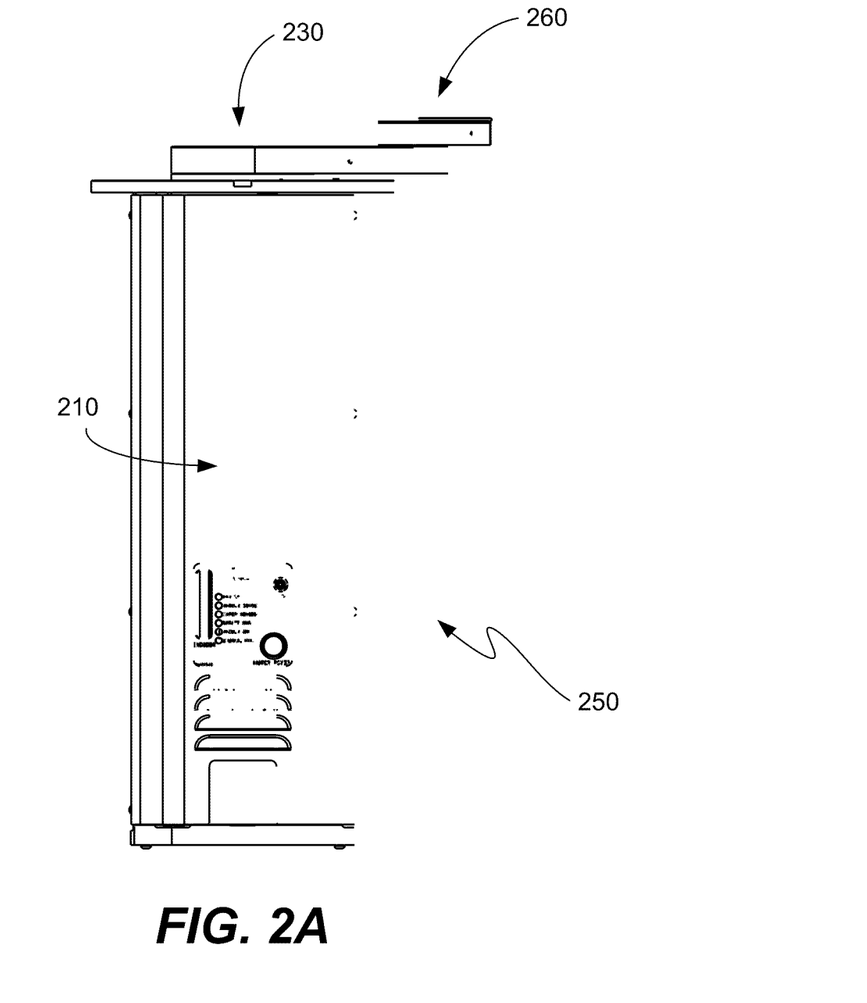
FIG. 2A shows a side view of a cylindrical robot in accordance with embodiments of the present invention.
Figure 2B:
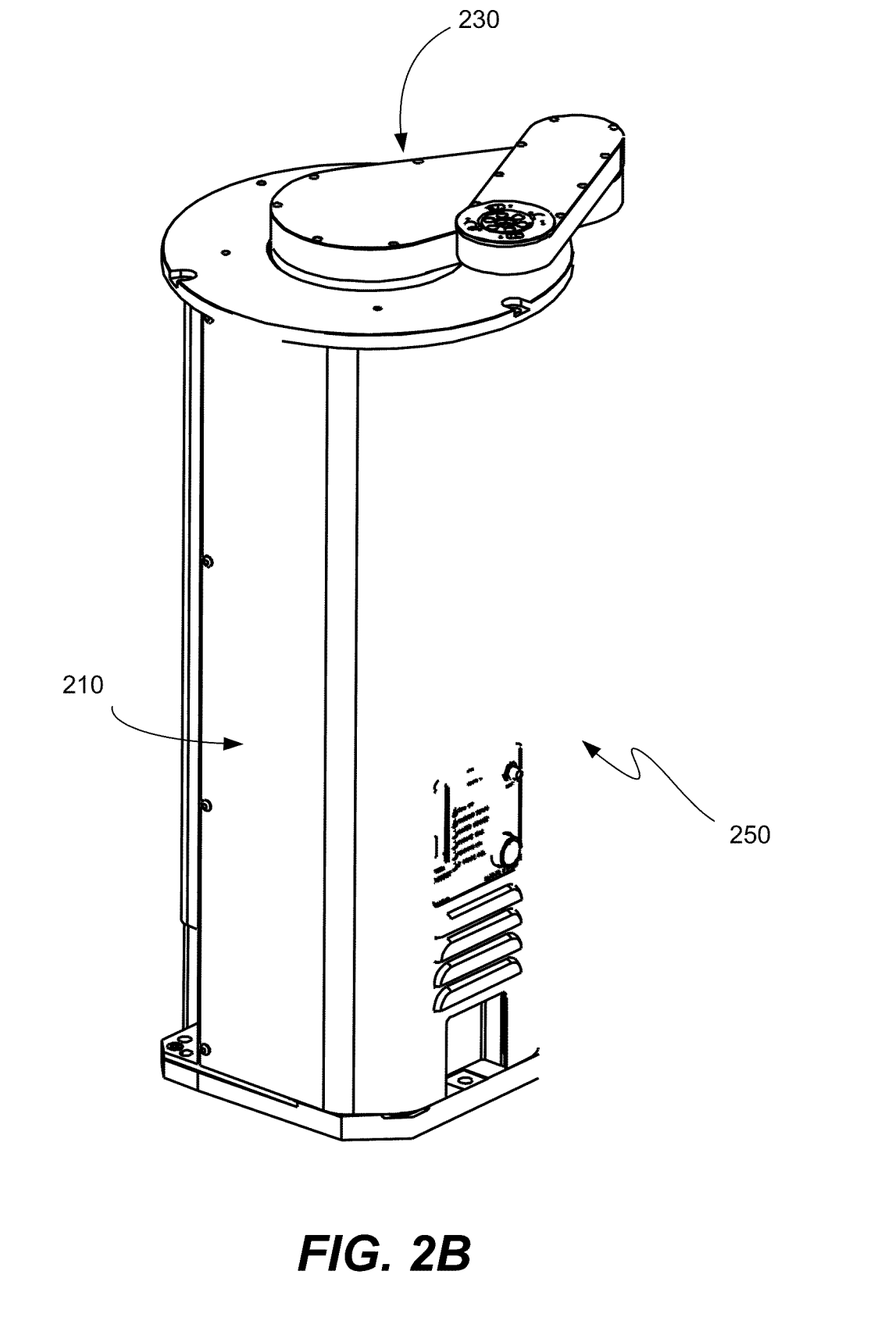
FIG. 2B shows a perspective view of a cylindrical robot in accordance with embodiments of the present invention.

FIGS. 2A and 2B show views of a robot 250 according to certain embodiments, with FIG. 2A showing a side view of a robot 250, having drive assembly housing 210, robot arm 230 and end effector 260, and FIG. 2B showing a perspective view of robot 250, including housing 210 and robot arm 230, to which an end effector may be connected. The rotational hardstop assemblies and methods described herein allow the robot arm to be rotated over 360°, without limiting the speed of long theta moves. This allows the ability to access processing stations, load locks or other pick/place locations from either direction of rotation without a continuous rotation design that would require complex slip ring assemblies and that would prohibit the use of standard high flex cables and tubing to be used through the shoulder axis. The rotational hardstop assembly provides a rotation angle up to 720° (limited only by the size of the assembly) and prevents over-rotation. The hardstop assembly includes magnets that act as non-contact springs for the stop. The magnets produce no noise, nor have any wear over time.

Figure 3A:
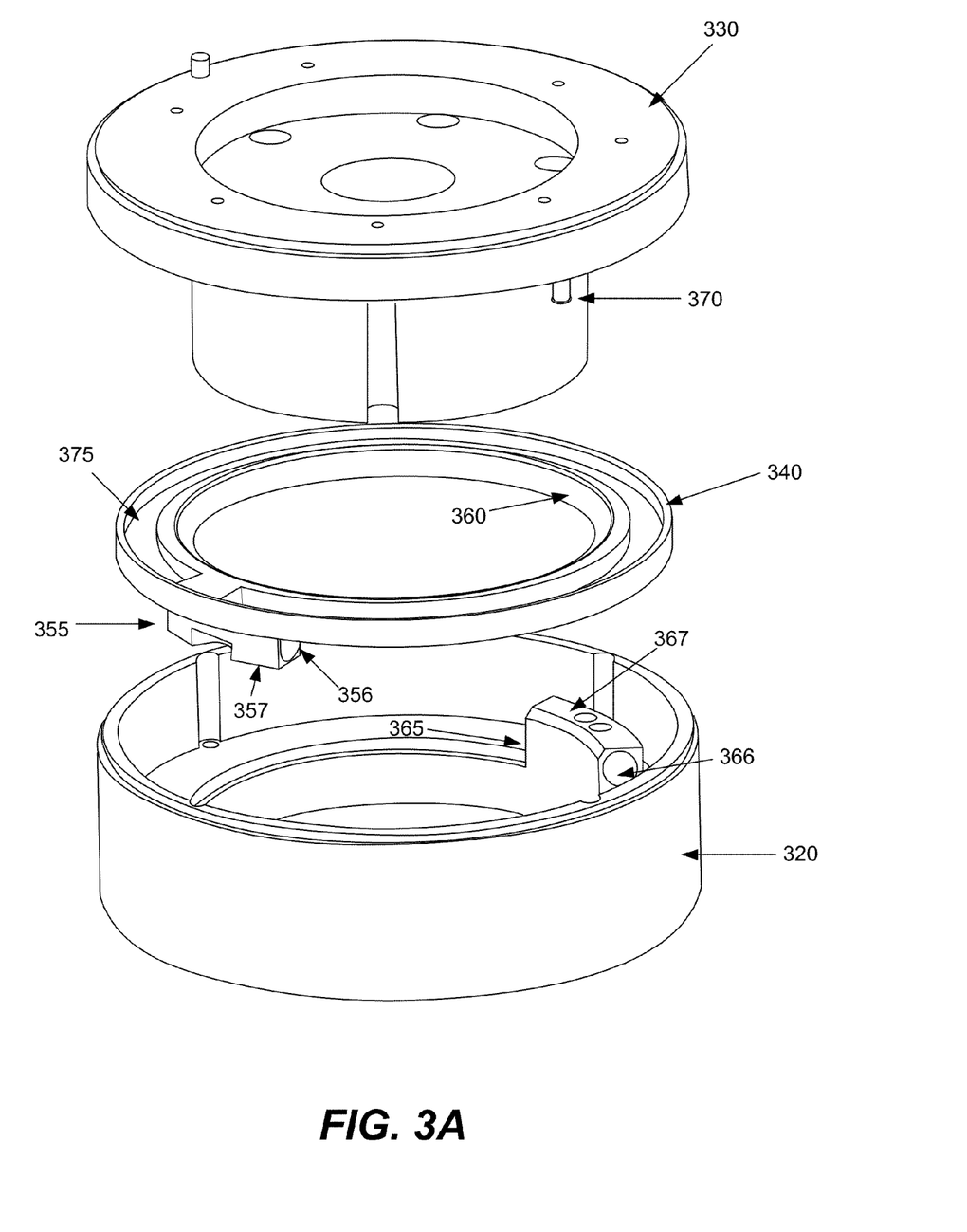
FIGS. 3A and 3B shows exploded views of the robot assembly according to an embodiment of the invention, including a shoulder with a stationary magnet assembly and a moving hardstop with a rotatable magnet assembly.
Figure 3B:
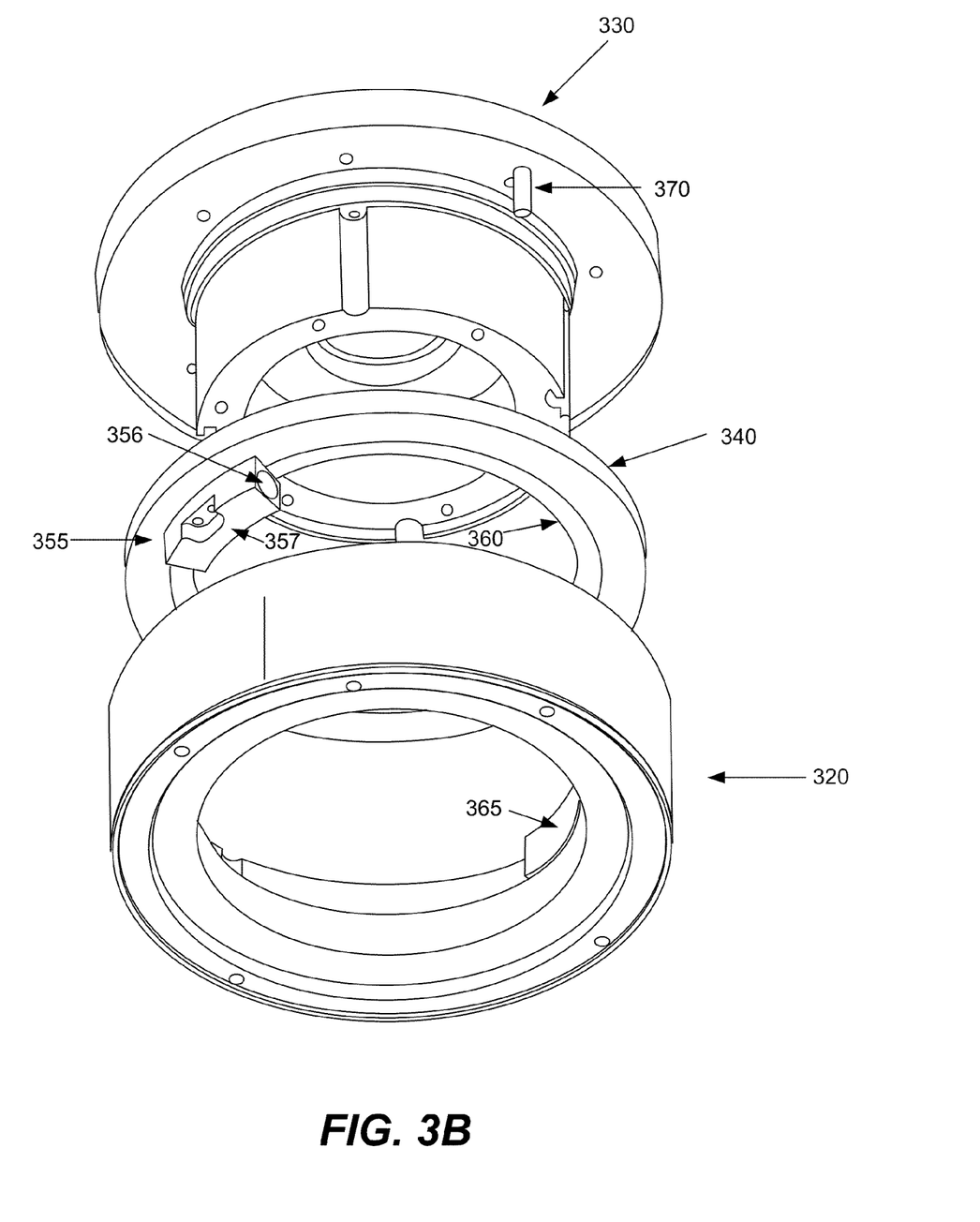

FIGS. 3A and 3B shows exploded views of the robot assembly according to an embodiment of the invention. Shoulder 320 is part of the drive and is stationary. The shoulder is generally a tubular member. Stationary magnet assembly 365 is mounted on the interior of shoulder 320 to engage with the rotational magnet assembly 355. Stationary magnet assembly 365 may include one or more bar magnets 366 in a housing 367, with a pole of the bar magnet or magnets exposed at each end of the assembly.

Rotatable flange 330 is connected to a drive shaft and rotates around the shoulder (Z) axis. The robot arm (not shown) attaches to flange 330. Moving hardstop 340 is mounted on a bearing 360 and includes a rotatable magnet assembly 355. Rotatable magnet assembly 355 includes one or more bar magnets 356 in a housing 357, with a pole of the bar magnet or magnets exposed at each end of the assembly. The stationary and rotatable magnet assemblies include bar magnets and are configured so that the polarity of facing stationary and rotatable magnet ends is the same. When the assemblies are close enough, the resulting repelling force is enough to overcome the drag resistance on the bearing.

The moving hardstop is a rotatable member that is configured to be rotated with the rotatable arm, until the rotatable magnet assembly 355 is engaged by the stationary magnet assembly 365. The friction between the bearing 360 and rotatable flange 330 is sufficient so that moving hardstop 340 rotates with rotatable flange 330 until engagement. Upon engagement, the friction of bearing 360 is overcome by the magnetic force. The rotatable flange arm is then able to continue to rotate up to the design limit. In the assembly depicted, a dowel pin 370 as a stop structure for the design limit. While rotating past an engaged stationary hardstop, the dowel pin 370 travels in the annular recess 375 of the hardstop. Appropriate sensor mechanisms, control circuitry and motors to detect the rotational position of the arm and reverse course at the design limit may be employed.

Figure 4:
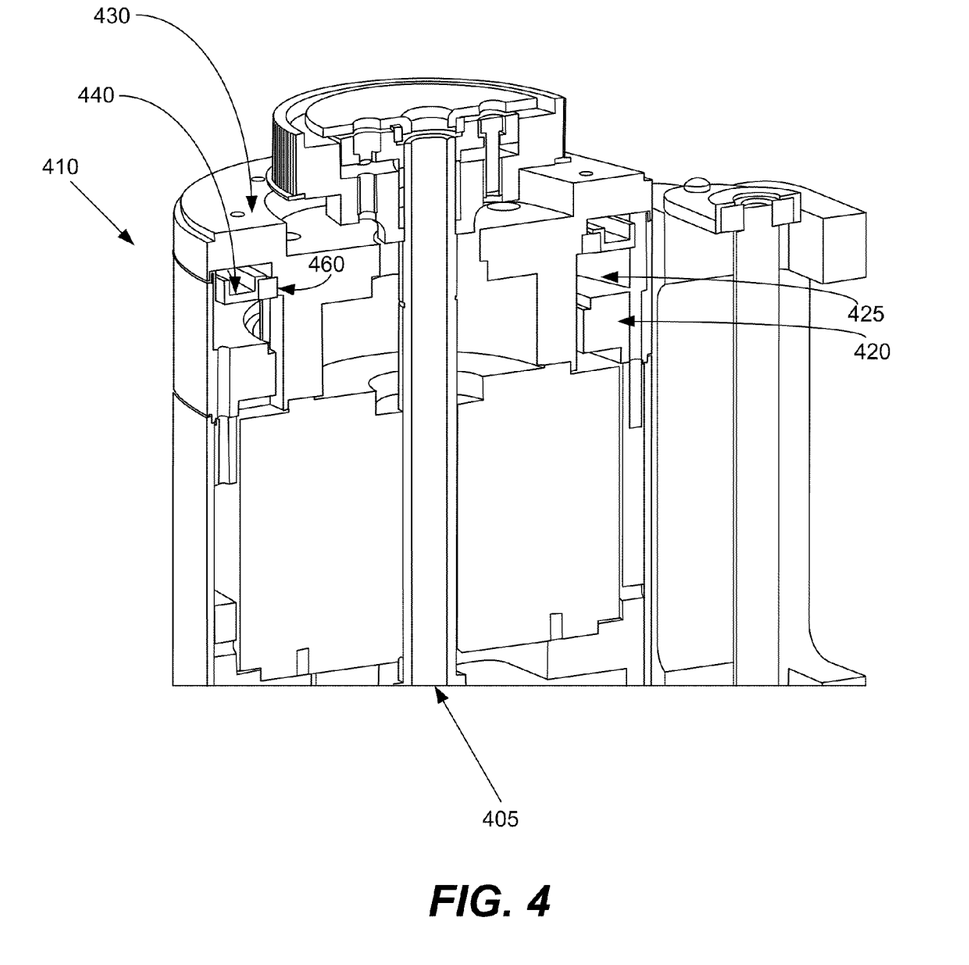
FIG. 4 shows a cross sectional view of a drive in accordance with embodiments of the present invention.

FIG. 4 shows a cross section view of a drive 410 depicted without an arm. Drive shaft 405 rotates rotatable flange 430 to which the arm is attachable. Shoulder 420 has annular recess 425, through which the rotatable magnet assembly (not shown), mounted on moving hardstop 440, travels through during rotation when not engaged with the stationary magnet assembly (not shown), which occupies a portion of the annular recess 425. Bearing 460 keeps moving hardstop 440 rotating with rotatable flange 430 until the magnet assemblies are close enough to engage and overcome the friction between moving hardstop 440 and rotatable flange 430.

Figure 5A:
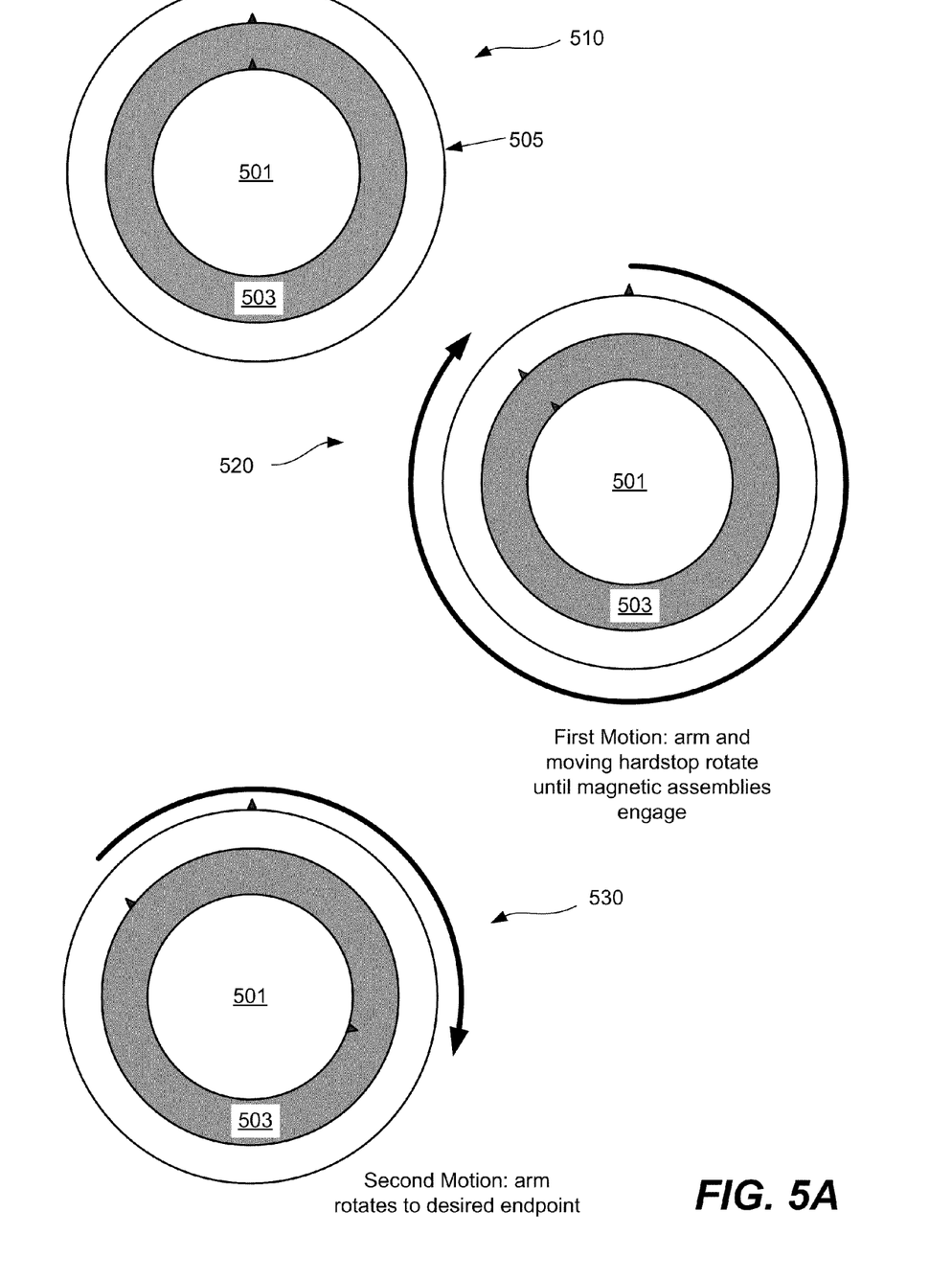
FIG. 5A shows representational diagrams illustrating rotational positions of a stationary shoulder, moving hardstop and robot arm during robot arm movements in a clockwise direction.
Figure 5B:
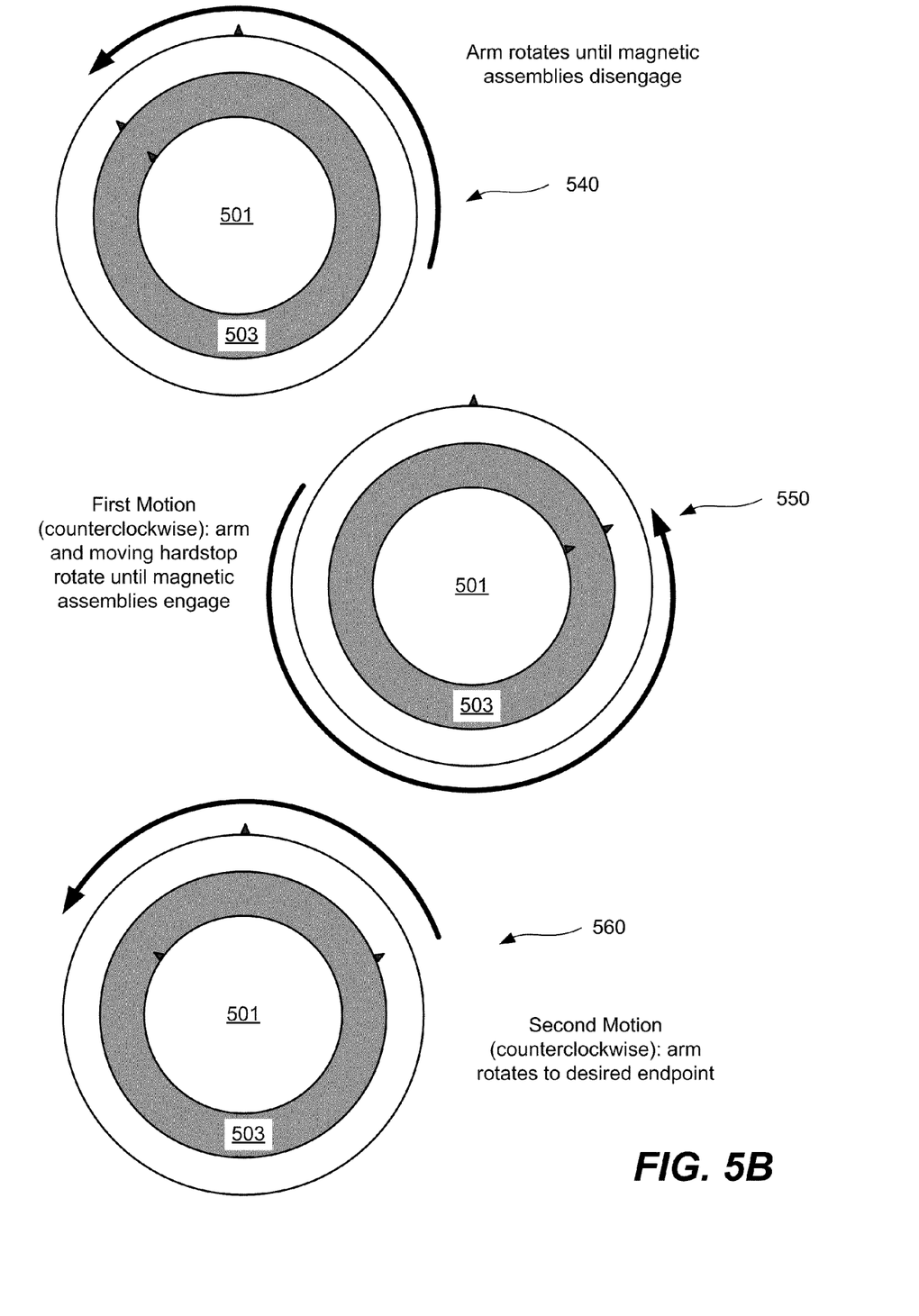
FIG. 5B shows representational diagrams illustrating rotational positions of a stationary shoulder, moving hardstop and robot arm during robot arm movements in a counterclockwise direction.

FIGS. 5A and 5B shows representational diagrams illustrating stationary shoulder, moving hardstop and robot arm during robot arm movements. First at 510, a robot arm 501, a moving hardstop 503 and a stationary shoulder 505 at an initial position are indicated. Divots are shown (here at the 12 o'clock position) to indicate the relative position of each component. The rotatable arm 501 and hardstop 503 are then rotated together as indicated at 520 to a second position in a first motion, at which point the rotatable magnet assembly (not shown) mounted on the movable hardstop engages with the stationary magnet assembly (not shown) mounted on the shoulder. The hardstop 503 remains stationary, while the rotatable arm 501 continues to the third position in a second motion, as indicated at 530.

The range of the first motion described above, i.e., the rotational motion that occurs when the moving hardstop is rotating is limited only by the size of the magnet assemblies and the number of rotational degrees they occupy. According to various embodiments, the range of the first motion is 0°-350°, 0-340°, 0-330°, or 0-320°, with the engaged magnet assemblies occupying no more than 10°, 20°, 30°, 40°, 50°, etc. The range of the second motion described above when the magnet assemblies are engaged and the hardstop is stationary with the shoulder is limited only by the size of pin assembly or other stop structure, and may be as large as 0-355°. The full range of the robot arm is thus as high as 720° less the physical space occupied by the stop structures, e.g., 630°, 640° or higher. In other embodiments, additional moving hardstops may be employed to achieve a larger range of motion. In certain embodiments, additional rotational magnetic hardstops are used.

FIG. 5B shows representational diagrams illustrating stationary shoulder, moving hardstop and robot arm during robot arm movement in the reverse (counterclockwise) direction. At 540, rotatable arm 501 has rotated from the third position indicated at 530 in FIG. 5A to the second rotational position at which the rotatable hardstop 503 is engaged. The hardstop 503 disengages and rotates with the arm 501 in a counter-clockwise direction to a fourth position, at which point the rotatable magnet assembly of the movable hardstop engages with the stationary magnet assembly of the shoulder. This is indicated at 550. The hardstop 503 remains stationary, while the rotatable arm 501 continues to a fifth position in a second motion, as indicated at 560.

Figure 6A:
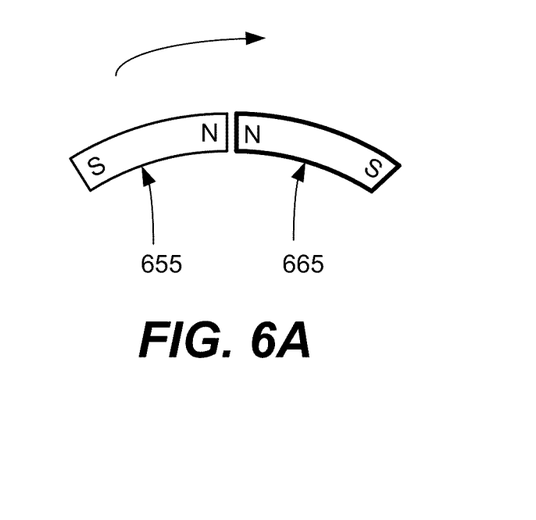
FIGS. 6A and 6B are schematics illustrating stationary and rotatable magnet assembly engagement during clockwise rotation by the robot arm (FIG. 6A) and engagement during counter-clockwise rotation (FIG. 6B) according to various embodiments.
Figure 6B:
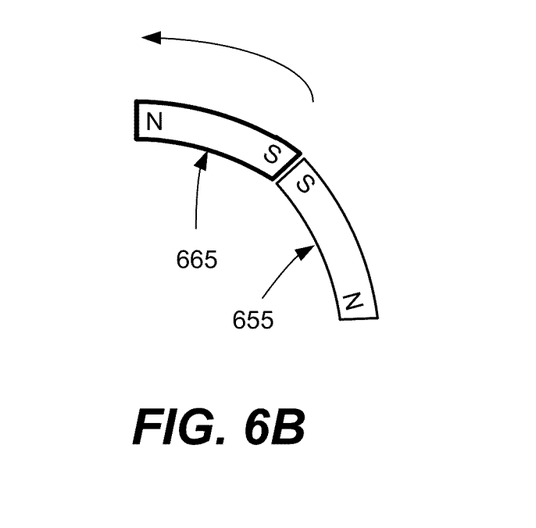

To obtain the maximum opposing force, in certain embodiments, the opposing magnets are configured to be centered and flat with respect to each other on engagement. FIGS. 6A and 6B are schematics showing arced stationary magnet 665 and rotational magnet 655, with FIG. 6A illustrating engagement during clockwise rotation by the robot arm and FIG. 6B illustrating engagement during counter-clockwise rotation.

As indicated above, the magnets are strong enough to overcome the force that allows the moving hardstop to rotate, which in the example above is a bearing. Examples of magnets that may be used are neodymium (ND) magnets. In a specific example, ND 35 or ND magnets are used. An example of a bearing is a KA thin series bearing (Kaydon®, Chicago, Ill.).

According to various embodiments, rotational speed of the robot arms described herein are up to 150 rpm, e.g., 120 rpm, or higher. This is compared to robots having hardstops in which a clicking noise associated with hardstop engagement at 30 rpm.

The figures and description presented above are merely examples of how the rotational hardstop assemblies may be configured and implemented.

What is claimed is:

1. An apparatus for limiting rotation in a mechanism having θ-rotational motion about a Z-axis, the apparatus comprising:
    a first member including a first magnet assembly with a first magnetic pole and a second magnetic pole;
    a second member including a first stop portion;
    a rotatable stop member including a second stop portion and a second magnet assembly with a third magnetic pole and a fourth magnetic pole; and
    a bearing that mounts the rotatable stop member to the second member, the bearing having a rotational drag resistance, wherein:
    the rotatable stop member and the second member are configured for relative rotational movement about the Z-axis with respect to one another,
    the first stop portion and the second stop portion are configured to engage each other to prevent the rotatable stop member and the second member from rotating more than 360° with respect to one another,
    the first member and the second member are configured for relative rotational movement about the Z-axis with respect to one another, and
    the first magnet assembly and the second magnet assembly are configured:
        such that the first magnetic pole and the third magnetic pole have the same polarity and generate a first repulsive force when brought into non-contacting, close proximity to one another through relative rotation between the first member and the rotatable stop member about the Z-axis in a first rotational direction,
        such that the second magnetic pole and the fourth magnetic pole have the same polarity and generate a second repulsive force when brought into non-contacting, close proximity to one another through relative rotation between the first member and the rotatable stop member about the Z-axis in a second rotational direction opposite the first rotational direction, and
        the first repulsive force and the second repulsive force are each greater than the rotational drag resistance and cause the rotatable stop member to rotate with respect to the second member without contact between the first magnet assembly and the second magnet assembly under normal operating conditions for the mechanism and absent engagement of the first stop portion and the second stop portion, wherein the rotatable stop member rotates together as a unit with the second member due to the rotational drag resistance under normal operating conditions for the mechanism and when the repulsive force between the first magnet assembly and the second magnet assembly is less than the first repulsive force or the second repulsive force.

2. The apparatus of claim 1, wherein the first magnet assembly and the second magnet assembly are configured to engage each other to prevent the rotatable stop member and the first member from rotating more than 360° with respect to one another.

3. The apparatus of claim 2, wherein the apparatus is configured such that the first magnet assembly and the second magnet assembly only contact each other after the first stop portion and the second stop portion contact each other for a single rotation.

4. The apparatus of claim 1, wherein:
    the first stop portion is provided by a stop structure that protrudes from the second member,
    the stop structure protrudes into an arc-shaped recess in the rotatable stop member, and
    the arc-shaped recess includes a first end and a second end, and the second stop portion is provided by the first end and the second end.

5. The apparatus of claim 1, wherein the first member is stationary and the second member rotates.

6. The apparatus of claim 1, wherein the second member is stationary and the first member rotates.

7. The apparatus of claim 1, wherein magnetic moments associated with the first pole, the second pole, the third pole, and the fourth pole are substantially tangent to a circle centered on the Z-axis and lying in a plane perpendiculat to the Z-axis.

8. The apparatus of claim 1, wherein the first magnet assembly and the second magnet assembly each include one or more magnets.

9. The apparatus of claim 1, wherein at least one of the one or more magnets is arced to match a curvature of the rotatable stop member.

10. The apparatus of claim 1, wherein the mechanism comprises a robotic arm mechanism capable of radial and θ-rotational motion.

11. A robot arm system, the robot arm system comprising:
    a robot arm configured for θ-rotational motion about a Z-axis; and
    an apparatus for limiting rotation in the robot arm, the apparatus comprising:
        a first member including a first magnet assembly with a first magnetic pole and a second magnetic pole;
        a second member including a first stop portion;
        a rotatable stop member including a second stop portion and a second magnet assembly with a third magnetic pole and a fourth magnetic pole; and
        a bearing that mounts the rotatable stop member to the second member, the bearing having a rotational drag resistance, wherein:
        the rotatable stop member and the second member are configured for relative rotational movement about the Z-axis with respect to one another,
        the first stop portion and the second stop portion are configured to engage each other to prevent the rotatable stop member and the second member from rotating more than 360° with respect to one another,
        the first member and the second member are configured for relative rotational movement about the Z-axis with respect to one another, and
        the first magnet assembly and the second magnet assembly are configured:
            such that the first magnetic pole and the third magnetic pole have the same polarity and generate a first repulsive force when brought into non-contacting, close proximity to one another through relative rotation between the first member and the rotatable stop member about the Z-axis in a first rotational direction, such that the second magnetic pole and the fourth magnetic pole have the same polarity and generate a second repulsive force when brought into non-contacting, close proximity to one another through relative rotation between the first member and the rotatable stop member about the Z-axis in a second rotational direction opposite the first rotational direction, and the first repulsive force and the second repulsive force are each greater than the rotational drag resistance and cause the rotatable stop member to rotate with respect to the second member without contact between the first magnet assembly and the second magnet assembly under normal operating conditions for the mechanism and absent engagement of the first stop portion and the second stop portion, wherein the rotatable stop member rotates together as a unit with the second member due to the rotational drag resistance under normal operating conditions for the mechanism and when the repulsive force between the first magnet assembly and the second magnet assembly is less than the first repulsive force or the second repulsive force.

12. The robot arm system of claim 11, the robot arm system further comprising a plurality of pick-and-place locations, wherein the robot arm is configured to move semiconductor wafers between each of the pick-and-place locations.

13. A method for using a rotatable stop member located between a first member and a second member, the rotatable stop member, the first member, and the second member all configured for relative rotatational motion about a Z-axis, and the rotatable stop member mounted to the second member by a bearing with a rotational drag resistance, the method comprising:

causing the second member to rotate in a first direction relative to the first member about the Z-axis a first rotational distance sufficient to cause a separation distance between a first magnet assembly on the first member and a second magnet assembly on the rotatable stop member to decrease such that a first repulsive force is generated that is equal to the rotational drag resistance, wherein the second magnet assembly and the rotatable stop member rotate with the second member due to the rotational drag resistance in the bearing during rotation through the first rotational distance; and causing the second member to rotate in the first direction relative to the first member about the Z-axis a second rotational distance beyond the first rotational distance, wherein, during rotation through the second rotational distance, the separation distance between the first magnet assembly and the second magnet assembly is non-zero, the first repulsive force is greater than the rotational drag resistance in the bearing, relative rotation between the rotatable hard stop and the second member is unobstructed, and the second magnet assembly and the rotatable stop member rotate relative to the second member due to the first repulsive force.

14. The method of claim 13, further comprising causing the second member to rotate in the first direction relative to the first member about the Z-axis a third rotational distance beyond the second rotational distance, wherein, during rotation through the third rotational distance, a first stop portion on the second member and a second stop portion on the rotatable stop member are engaged and cause the rotatable stop member to rotate with the second member.

15. The method of claim 14, further comprising causing the second member to rotate in the first direction relative to the first member about the Z-axis a fourth rotational distance beyond the third rotational distance, wherein, during rotation through the fourth rotational distance, the first stop portion on the second member and the second stop portion on the rotatable stop member are engaged and cause the rotatable stop member to rotate with the second member and the first magnet assembly and the second magnet assembly are in contact with each other after the rotation through the fourth rotational distance is complete, thereby preventing further relative rotational movement in the first direction between the first member and the second member in the direction of rotation.

* * * * *